United States Patent
Namekawa et al.

(10) Patent No.: US 7,388,770 B2
(45) Date of Patent: Jun. 17, 2008

(54) ONE-TIME PROGRAMABLE MEMORY WITH ADDITIONAL PROGRAMMING TIME TO ENSURE HARD BREAKDOWN OF THE GATE INSULATING FILM

(75) Inventors: Toshimasa Namekawa, Tokyo (JP); Hiroaki Nakano, Yokohama (JP); Hiroshi Ito, Yokohama (JP); Atsushi Nakayama, Kawasaki (JP); Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 11/221,943

(22) Filed: Sep. 9, 2005

(65) Prior Publication Data
US 2006/0158923 A1 Jul. 20, 2006

(30) Foreign Application Priority Data
Jan. 13, 2005 (JP) .............................. 2005-006434

(51) Int. Cl.
*G11C 17/00* (2006.01)
(52) U.S. Cl. ............... 365/94; 365/189.07; 365/189.09
(58) Field of Classification Search .................. 365/94, 365/189.07
See application file for complete search history.

(56) References Cited

U.S. PATENT DOCUMENTS 6,434,060 B1 * 8/2002 Tran et al. ............. 365/189.07
6,700,151 B2 * 3/2004 Peng ........................... 257/298
6,700,176 B2 * 3/2004 Ito et al. ...................... 257/530

FOREIGN PATENT DOCUMENTS

| JP | 2003-123496 | 4/2003 |
| JP | 2004-366447 | 12/2004 |

OTHER PUBLICATIONS

U.S. Appl. No. 11/221,943, filed Sep. 9, 2005, Namekawa, et al.
U.S. Appl. No. 11/360,670, filed Feb. 24, 2006, Ito.
U.S. Appl. No. 10/898,249, filed Jul. 26, 2004, Hiroshi Ito, et al.
U.S. Appl. No. 11/733,933, filed Apr. 11, 2007, Namekawa, et al.

* cited by examiner

*Primary Examiner*—Pho M. Luu
(74) *Attorney, Agent, or Firm*—Oblon, Spivak, McClelland, Maier & Neustadt, P.C.

(57) ABSTRACT

A nonvolatile semiconductor memory device includes a storage element which is programmed with information by breaking an insulating film by application of electrical stress to the storage element, a control switch which controls the application of electrical stress to the storage element, and a control circuit which controls conduction/nonconduction of the control switch. The device further includes a power supply circuit including a voltage generation circuit which generates a first voltage to cause the electrical stress in program operation, a sensing circuit which senses that the insulating film is broken down, and a counter circuit which controls the control circuit to interrupt the application of electrical stress to the storage element when a given period of time elapses after the sensing circuit senses that the insulating film is broken down.

7 Claims, 9 Drawing Sheets

ONE-TIME PROGRAMABLE MEMORY WITH ADDITIONAL PROGRAMMING TIME TO ENSURE HARD BREAKDOWN OF THE GATE INSULATING FILM

CROSS-REFERENCE TO RELATED APPLICATIONS

This application is based upon and claims the benefit of priority from prior Japanese Patent Application No. 2005-006434, filed Jan. 13, 2005, the entire contents of which are incorporated herein by reference.

BACKGROUND OF THE INVENTION

1. Field of the Invention

The present invention relates to a nonvolatile semiconductor memory device. More specifically, the invention relates to a one-time programmable (OTP) memory using irreversible storage elements to which information can be written only once.

2. Description of the Related Art

Recently, an OTP memory using storage elements of an insulating film breakdown type, such as an anti-fuse element (or an electrical-fuse element), has been proposed as an irreversible storage element. The OTP memory stores information by applying a high voltage that exceeds the maximum rating to a semiconductor element having a metal oxide semiconductor (MOS) structure and electrically breaking a gate insulating film of the semiconductor element. The OTP memory using the anti-fuse element as a storage element is used chiefly to store information "0" in the anti-fuse element whose insulating film has not been broken down and information "1" in the anti-fuse element whose insulating film has been broken down.

The OTP memory is also used to store information for replacing a defective element with a dynamic random access memory (DRAM) or the like.

In order to read information stably from the anti-fuse element, the broken gate insulating film needs to be brought into good electrical conduction. It is thus important to apply adequate electrical energy (current stress) to the broken gate insulating film to break it down completely or bring it into a hard breakdown.

As described above, a considerably large amount of current needs to flow through a gate insulating film for a given period of time when the OTP memory is programmed (information is written to the OTP memory). If, however, the current continues to flow for a longer time than required, an excessive stress is applied to circuits other than the anti-fuse element including the gate insulating film. The read characteristic therefore deteriorates conversely. For example, there occurs a problem that read current is reduced by hollows caused in wires by migration due to a large amount of current.

In general, times required for breaking down a gate insulating film, or program times required from when a high voltage is applied to an anti-fuse element until information is written to the anti-fuse element vary among anti-fuse elements. Even though the OTP memory is programmed by applying such a high voltage as to break down the gate insulating films of a number of anti-fuse elements instantaneously (not longer than 10 µs) for a given period of time (about 100 µs), anti-fuse elements whose gate insulating films are not broken down completely, or anti-fuse elements that fail to store information remain with a certain probability. The program times are sensitive to variations in environmental conditions such as applied voltage and temperature. These problems should be resolved in order to appropriately control electrical energy applied to an anti-fuse element whose gate insulating film has been broken down.

In order to simply lower the incidence of anti-fuse elements that fail to store information, it is effective to apply a high voltage, apply a voltage for a long time, or the like. If, however, these measures are taken, it is likely that a greater electrical stress will be applied to a number of anti-fuse elements whose gate insulating films are broken down at early time. To increase a voltage to be applied becomes a great stress on anti-fuse elements which are not programmed or to which no information is written. It is not favorable in terms of reliability. To lengthen the time of application of voltage increases the program time and prevents the OTP memory from increasing in storage capacity.

In the above prior art OTP memory, the electrical energy to be applied to the broken gate insulating film of an anti-fuse element needs to be controlled appropriately in order to break down the gate insulating film completely (hard breakdown).

A method of controlling electrical energy applied to a gate insulating film has been proposed in, for example, Jpn. Pat. Appln. KOKAI Publication No. 2003-123496 (corresponding to U.S. Pat. No. 6,434,060 B1). This method has the problems that the electrical energy applied to the broken gate insulating film cannot be controlled appropriately and the device increases in size as the storage capacity becomes large.

BRIEF SUMMARY OF THE INVENTION

According to a first aspect of the present invention, there is provided a nonvolatile semiconductor memory device comprising a storage element which is programmed with information by breaking an insulating film by application of electrical stress to the storage element, a control switch which controls the application of electrical stress to the storage element, a control circuit which controls conduction/nonconduction of the control switch, and a power supply circuit including a voltage generation circuit which generates a first voltage to cause the electrical stress in program operation, a sensing circuit which senses that the insulating film is broken down, and a counter circuit which controls the control circuit to interrupt the application of electrical stress to the storage element when a given period of time elapses after the sensing circuit senses that the insulating film is broken down.

According to a second aspect of the present invention, there is provided a nonvolatile semiconductor memory device comprising a storage element which is programmed with information by breaking an insulating film by application of electrical stress to the storage element, a control switch which controls the application of electrical stress to the storage element, a control circuit which controls conduction/nonconduction of the control switch, and a power supply circuit including a voltage generation circuit which generates a first voltage to cause the electrical stress in program operation, a sensing circuit which senses that the insulating film is broken down, and a counter circuit which controls the control circuit to interrupt the application of electrical stress to the storage element when a given period of time elapses after the sensing circuit senses that the insulating film is broken down, wherein the control circuit completes the program operation by setting the control switch in nonconduction after the electrical stress is continuously applied to the storage element for a given period of time that is determined by a count operation of the counter circuit.

According to a third aspect of the present invention, there is provided a nonvolatile semiconductor memory device comprising a storage element of an insulating film breakdown type, which is programmed with information, a power supply circuit connected to one end of the storage element to apply a high voltage that is not lower than a maximum rating to the storage element, an open/close switch connected to another end of the storage element to control application of the high voltage to the storage element from the power supply circuit, a control circuit which controls an open/close operation of the open/close switch, a sensing circuit which senses that an insulating film of the storage element is broken down by the application of the high voltage from the power supply circuit, an oscillator which oscillates, and a counter circuit which counts in response to an output of the sensing circuit and an output of the oscillator, wherein the device is programmed by controlling the control circuit such that an output of the counter circuit interrupts the application of the high voltage to the storage element from the power supply circuit after a lapse of a given period of time.

DETAILED DESCRIPTION OF THE INVENTION

Embodiments of the present invention will be described with reference to the accompanying drawings.

First Embodiment

Figure 1:
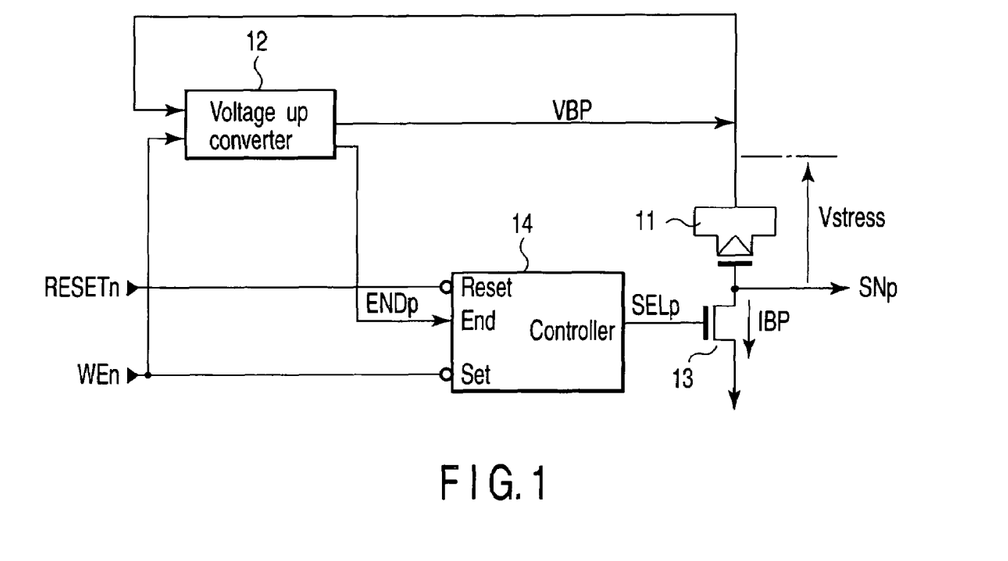
FIG. 1 is a circuit diagram showing a basic arrangement of an OTP memory according to a first embodiment of the present invention.

FIG. 1 shows a basic arrangement of an OTP memory (nonvolatile semiconductor memory device) according to a first embodiment of the present invention. The OTP memory uses an anti-fuse element (a semiconductor element having a MOS structure) as a storage element and can be written with information only once. In the first embodiment, the OTP memory includes an internal step-up power supply that generates a high voltage VBP (e.g., 7 V) for writing as a first voltage to be applied to the anti-fuse element based on a relatively low voltage (e.g., 2.5 V) supplied from the outside.

Referring to FIG. 1, an internal step-up power supply (voltage up converter) 12 serving as a power supply circuit is connected to one end (source/drain) of an anti-fuse element 11 corresponding to an insulating film breakdown type storage element that is programmed with information. One of the source and drain of an n-type MOS transistor serving as an open/close switch (control switch) 13 is connected to the other end (gate) of the anti-fuse element 11. By sensing a potential SNp at the connection node between the element 11 and switch 13, information ("0"/"1" data) can be read out of the element 11.

The other of the source and drain of the n-type MOS transistor or that of the open/close switch 13 is grounded (connected to a ground power supply), and the gate thereof is connected to a control circuit (controller) 14. The internal step-up power supply 12 is connected to the control circuit 14.

The control circuit 14 controls the conducting and non-conducting states of the open/close switch 13 and includes a terminal that receives a control signal from the outside, such as a terminal "reset" for reversing and receiving a reset signal RESETn and a terminal "set" for reversing and receiving a write command signal WEn. The control circuit 14 also includes a terminal "end" that receives a write end signal ENDp from the internal step-up power supply 12 and a terminal that supplies a selection signal SELp to the gate of the open/close switch 13.

The internal step-up power supply 12 generates a voltage to be applied to the anti-fuse element 11. In write mode (program operation), the power supply 12 generates a high voltage VBP (which is not lower than the maximum rating of the anti-fuse element 11) for writing. In read mode (read operation), it generates a low voltage (e.g., 1.5 V) for reading as a second voltage. The second voltage is lower than the high voltage VBP and does not break a gate insulating film of the anti-fuse element 11. The power supply 12 has a function of sensing that the gate insulating film of the element 11 varies from a soft breakdown to a hard breakdown in program operation.

The internal step-up power supply 12 has a terminal from which the low voltage or high voltage VBP is applied to the anti-fuse element 11. The power supply 12 also has a terminal from which the write end signal ENDp is output to the control circuit 14. Furthermore, the power supply 12 has a terminal to which the high voltage VBP is fed back and a terminal that receives a control signal (e.g., the write command signal WEn) from the outside.

A write operation (program operation) of the foregoing OTP memory will be described in brief. First, the control circuit 14 receives a reset signal RESETn from the outside and initializes its internal state at the same time when a power supply voltage VDD (e.g., 1.5 V) is applied to operate the OTP memory. In this initialization, the selection signal SELp becomes low in potential and the open/close switch 13 is brought into nonconduction. After that, the internal step-up power supply 12 applies a voltage VBP high enough to break the gate insulating film of the anti-fuse element 11. Under this condition, the open/close switch 13 is brought into nonconduction, and thus a desired electrical stress, namely a voltage stress (high field stress) Vstress is not applied to the anti-fuse element 11.

Upon receiving a write command signal WEn from the outside, the control circuit 14 activates the selection signal SELp to bring the open/close switch 13 into conduction. Consequently, the desired voltage stress Vstress is applied to the anti-fuse element 11 to start a program operation.

The gate insulating film of the anti-fuse element 11 is broken down by the application of the voltage stress Vstress. Thus, the amount of current IBP that flows through the anti-fuse element 11 increases suddenly.

If the internal step-up power supply 12 senses a variation in the amount of current IBP, namely a variation in the gate insulating film of the element 11 from a soft breakdown to a hard breakdown, it outputs a write end signal ENDp after a lapse of a given period of time. The write end signal ENDp is sent to the control circuit 14. Thus, the control circuit 14 inactivates the selection signal SELp again and brings the open/close switch 13 into nonconduction. Accordingly, the operation of programming the anti-fuse element 11 is completed.

As described above, the program operation is completed after a lapse of a given period of time after the internal step-up power supply 12 senses a variation to a hard breakdown. Thus, the electrical stress applied to the broken gate insulating film, namely the current stress (electrical energy) is easy to control appropriately. Consequently, the gate insulating film of the anti-fuse element 11 can be brought into a completely breakdown state (hard breakdown) at all times without increasing the size of the OTP memory in accordance with an increase in storage capacity.

In the OTP memory described above (FIG. 1), the anti-fuse element 11 is configured as a p-type MOS transistor. If the element 11 is an irreversible element through which almost no current flows before writing (in non-program state) and whose electrical characteristics are broken by applying a high voltage to bring the element into conduction, it can produce the same advantage regardless of its configuration.

Figure 2:
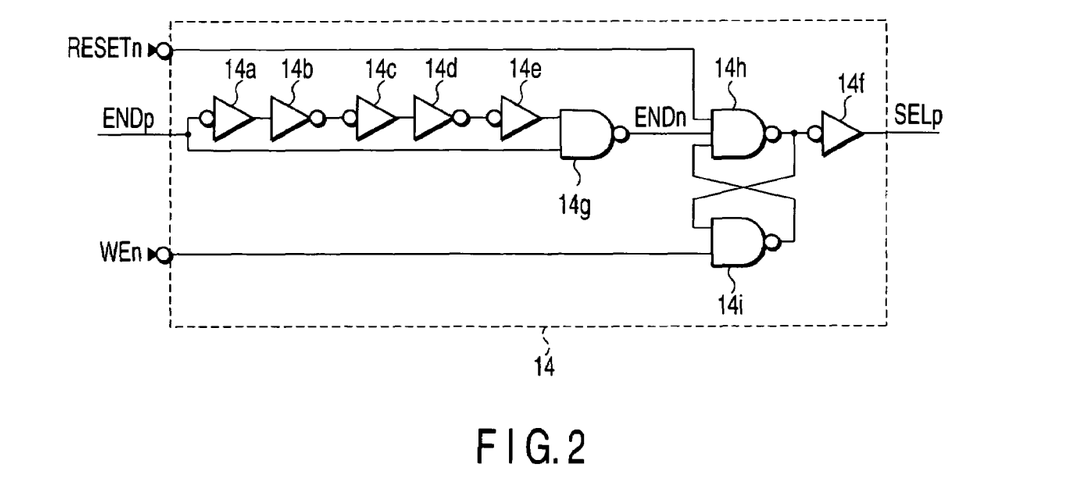
FIG. 2 is a circuit diagram showing an arrangement of a control circuit in the OTP memory shown in FIG. 1.

FIG. 2 shows the arrangement of the control circuit 14 in the OTP memory in more detail. The control circuit 14 includes six inverter circuits 14a to 14f and three NAND circuits 14g to 14i. Of these six inverter circuits, five inverter circuits 14a to 14e are connected in series. The input terminal (the above-described terminal "end") of the first-stage inverter circuit 14a is supplied with a write end signal ENDp from the internal step-up power supply 12. The output terminal of the final-stage inverter circuit 14e is connected to one of input terminals of the NAND circuit 14g. The other input terminal (the above-described terminal "end") of the NAND circuit 14g is supplied with the write end signal ENDp from the power supply 12.

The output terminal of the NAND circuit 14g is connected to a first input terminal of the NAND circuit 14h that forms an SR latch circuit. The first input terminal of the NAND circuit 14h is supplied with a write end signal ENDn. A second input terminal (the above-described terminal "reset") of the NAND circuit 14h is supplied with the reset signal RESETn. The output terminal of the NAND circuit 14i that forms the SR latch circuit is connected to a third input terminal of the NAND circuit 14h. The output terminal of the NAND circuit 14h is connected to one of input terminals of the NAND circuit 14i. The other input terminal (the above-described terminal "set") of the NAND circuit 14i is supplied with the write command signal WEn. The output terminal of the NAND circuit 14h is connected to the gate of the open/close switch 13 via the inverter circuit 14f to output the selection signal SELp.

Figure 3:
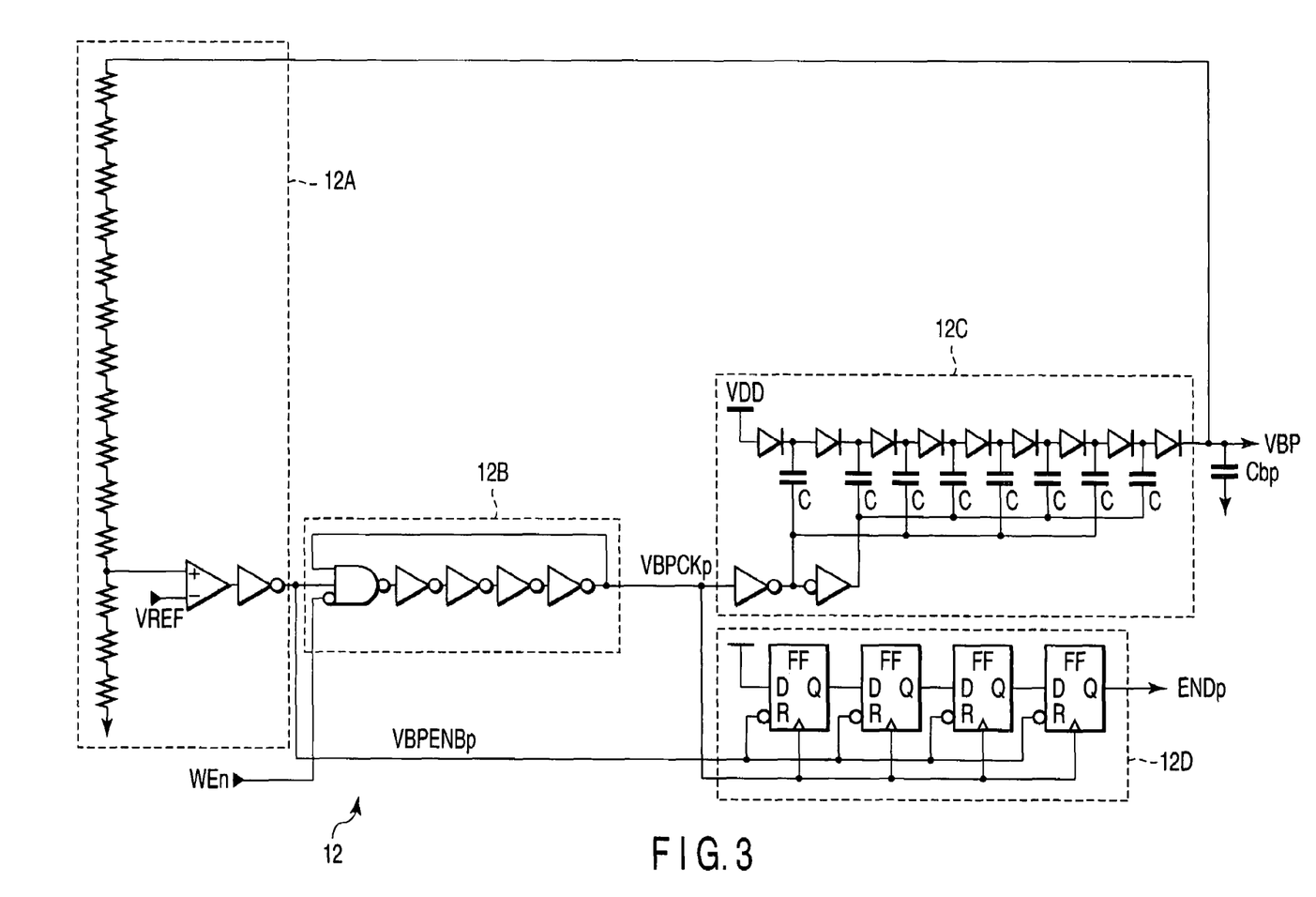
FIG. 3 is a circuit diagram showing an arrangement of an internal step-up power supply in the OTP memory shown in FIG. 1.

FIG. 3 shows the arrangement of the internal step-up power supply 12 in the OTP memory in more detail. The power supply 12 includes a potential sensing circuit (sensing circuit) 12A, an oscillator 12B, a charge pump circuit (voltage generation circuit) 12C, a replenished charge measuring device (counter circuit) 12D and a load capacitor Cbp. The circuit 12A, oscillator 12B and circuit 12C make up a feedback loop to generate a high voltage VBP stably.

The potential sensing circuit 12A compares a step-up power supply voltage VBP with a reference power supply voltage VREF and controls the power supply current to be supplied to the charge pump circuit 12C to keep the step-up power supply voltage VBP at a fixed value (set potential). In information write mode (program operation), the circuit 12A senses that the gate insulating film of the anti-fuse element 11 varies from a soft breakdown to a hard breakdown in accordance with a variation in the amount of current flowing through the element 11.

The oscillator 12B is, for example, a five-stage ring oscillator and its oscillation and stopping are controlled in response to an output VBPENBp of the potential sensing circuit 12A.

The charge pump circuit 12C is, for example, an eight-stage Dickson charge pump and operates upon receipt of an output VBPCKp of the oscillator 12B. The charges that are step up by the charge pump circuit 12C are stored in the load capacitor Cbp. The load capacitor Cbp is a decoupling capacitor between the power supply voltage VBP and ground power supply potential. The load capacitor Cbp is not essential because it is unnecessary when the parasitic capacitance of the circuit 12C is adequately large.

When the current supply capability of the charge pump circuit 12C exceeds the current consumed by a load, the step-up power supply voltage VBP rises. If this voltage VBP becomes not lower than the potential set by the reference power supply voltage VREF, the potential sensing circuit 12A outputs a sensing signal and the oscillator 12B stops operating. If the step-up power supply voltage VBP is divided at a resistance ratio of eleven to three and its intermediate potential is compared with the reference power supply voltage VREF (e.g., 1.5 V), a step-up power supply voltage VBP of 7 V is obtained.

When the oscillator 12B stops operating, the charge pump circuit 12C supplies no current and the current consumption of the load decreases the step-up power supply voltage VBP. When the potential sensing circuit 12A senses that the step-up power supply voltage VBP decreases, the oscillator 12B restarts to oscillate. Repeating these operations, the step-up power supply voltage VBP can be maintained at the set potential.

The output VBPENBp of the circuit 12A and the output VBPCKp of the oscillator 12B are also input to the replenished charge measuring device 12D. The measuring device 12D can be configured by a simple CR delay circuit; however, in the first embodiment, the VBPCKp of the oscillator 12B supplied to the charge pump circuit 12C is used as a clock. In other words, the measuring device 12D is composed of a four-stage flip-flop circuit (e.g., 32-bit counter) FF. When the charge pump circuit 12C continuously performs a step-up operation four times, the measuring device 12D outputs a write end signal ENDp.

In the replenished charge measuring device 12D, the number of stages $N_{FF}$ of the flip-flop circuit FF is determined based on the following electrical energy $E_{BD}$ required when the anti-fuse element 11 in write mode (program operation) varies from a soft breakdown to a hard breakdown:

$$E_{BD} < \beta N_{FF} C V_{DD}$$

where $\beta$ is the energy efficiency of the entire OTP memory, C is the capacitance of the charge pump circuit 12C and $V_{DD}$ is the power supply voltage of the circuit 12C. The upper limit of the number of stages $N_{FF}$ is determined not to apply excessive electrical energy which brings even the non-programmed anti-fuse element 11 into a hard breakdown.

In general, the charge transfer efficiency of the charge pump circuit 12C is not so good and $\beta$ is considerably smaller than "1". It is thus predicted that the number of stages $N_{FF}$ in the actual charge pump circuit is larger than that in the first embodiment. It is also predicted that the circuit arrangement becomes more complicated than that of the first embodiment since the former requires a function of adjusting the number of stages $N_{FF}$ through a trial product. In either case, the principal functions of sensing the completion of write of information to the anti-fuse element 11 in accordance with a variation in the state of the power supply 12 and then completing the program operation by applying a fixed current stress (electrical energy) to the element 11 are the same as those of the circuit of the present embodiment.

Figure 4:
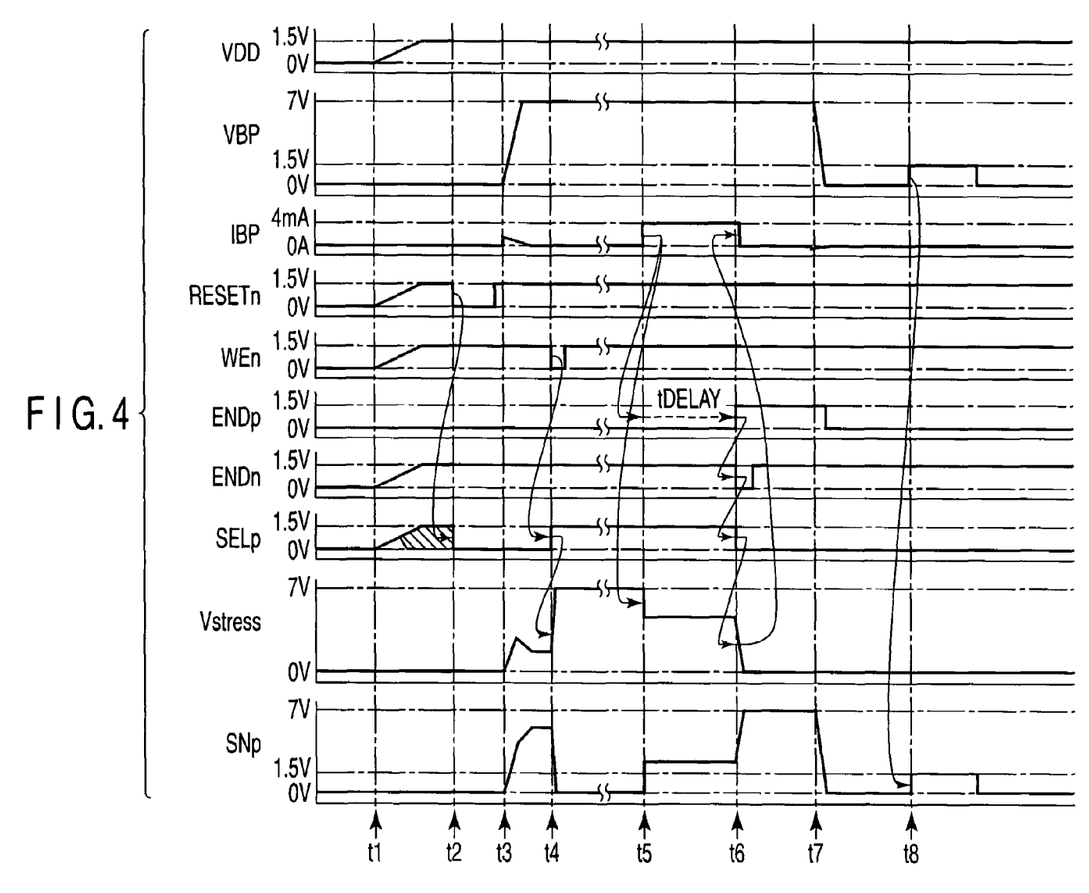
FIG. 4 is a timing chart illustrating an operation of the OTP memory shown in FIG. 1.

FIG. 4 is a timing chart illustrating an operation of the foregoing OTP memory. This operation will be described below with reference to FIG. 4.

At timing t1, a power supply voltage VDD is applied to operate the OTP memory. At timing t2, a reset signal RESETn is input to the control circuit 14 to initialize its internal state. The reset signal RESETn is a negative logic signal and normally maintains at a high level. If the reset signal RESETn is set low, the control circuit 14 is initialized. Upon receiving the low-level reset signal RESETn, the open/close switch 13 is brought into nonconduction. Even though the reset signal RESETn changes to a high-level one, the open/close switch 13 maintains in the nonconducting state.

At timing t3, the internal step-up power supply 12 applies a high voltage VBP of, e.g., 7 V, which exceeds the maximum rating of the anti-fuse element 11. The open/close switch 13 is in a nonconducting state. With the advantages of leakage current and coupling capacitance of the gate insulating film of the anti-fuse element 11, the potential SNp at the connection node between the element 11 and switch 13 increases, and the voltage stress applied to the element 11 gradually reduces. Under this condition, the gate insulating film of the element 11 is not broken down and, in other words, no information is written to the element 11.

The above voltage stress can be seen as the behavior of "Vstress" in FIG. 4. The leakage current of the gate insulating film of the anti-fuse element 11 and the current charged and discharged due to the coupling capacitance can be seen as "IBP" in FIG. 4.

At timing t4, a write command signal WEn is supplied to the internal step-up power supply 12 from the outside. The signal WEn is a negative logic signal, and gives an instruction to start a write operation when it is at a low level. The signal WEn is also supplied to the terminal "set" of the SR latch circuit in the control circuit 14. Once the level of the signal WEn becomes low, the program operation continues even after that of the signal WEn becomes high.

The open/close switch 13 is brought into conduction by activating a selection signal SELp supplied from the control circuit 14. The potential SNp at the connection node between the element 11 and switch 13 becomes almost 0 V. One end of the element 11 is connected to the power supply 12, and the voltage (VBP) of 7 V is applied to the one end. Thus, a high field voltage stress (Vstress) is applied to the gate insulating film of the anti-fuse element 11.

If the high field voltage stress (Vstress) is continuously applied to the gate insulating film of the element 11, the gate insulating film will be finally broken down.

Times required from when the voltage stress Vstress is applied to the gate insulating film until the gate insulating film is broken down, or program times required for writing information widely varies among anti-fuse elements.

Figure 5:
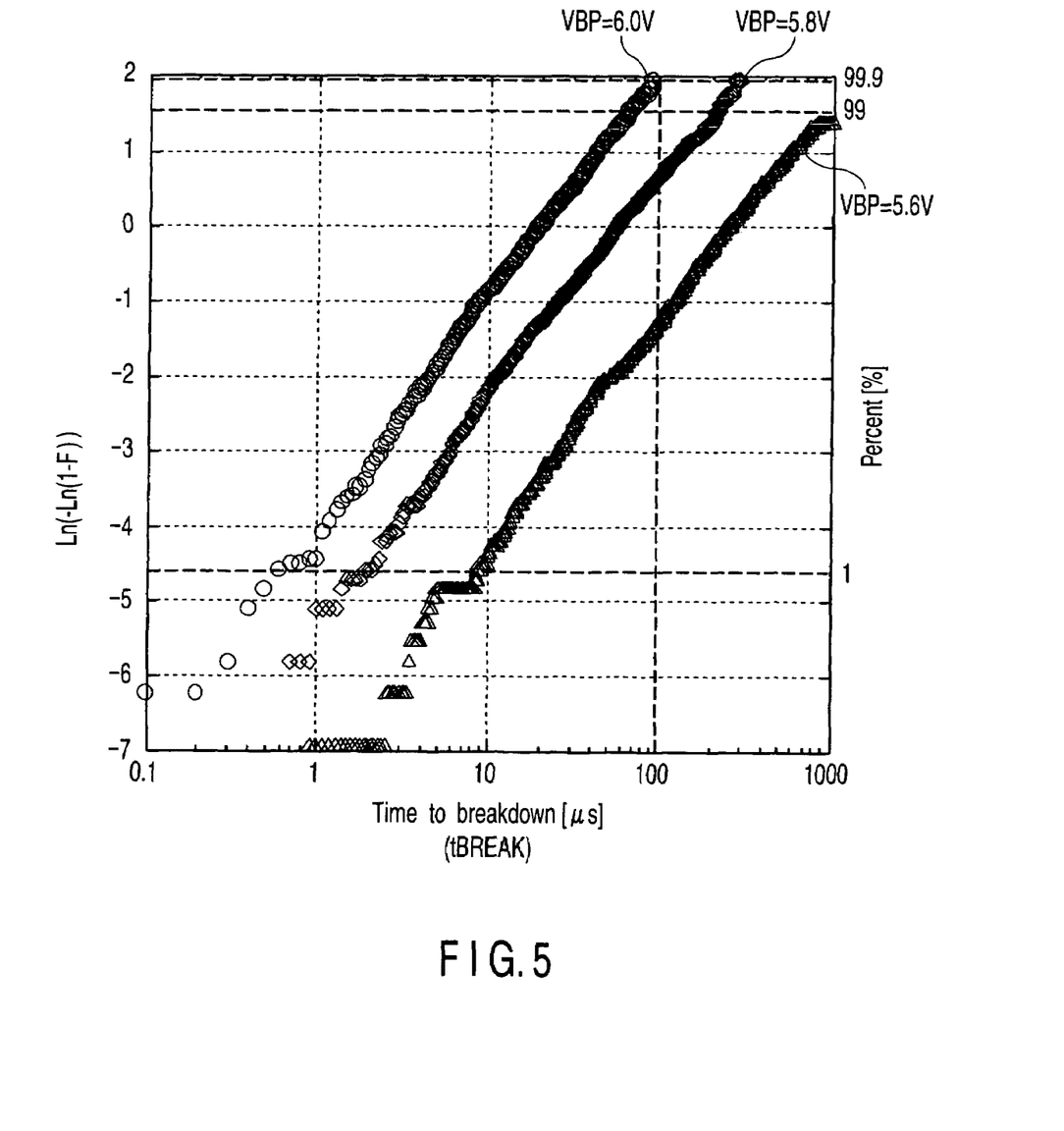
FIG. 5 is a graph illustrating write time characteristics (Weibull plot), taking an insulating film breakdown type storage element as an example.

FIG. 5 is a graph showing measured results of time required for writing information when high voltages VBP of 5.6 V, 5.8 V and 6.0 V are each applied to a gate insulating film the area of which is 0.6 μm² and the thickness of which is 1.7 nm at room temperature. In the graph, the abscissa axis indicates time (tBREAK) [μs] required from when the voltage stress is applied to the gate insulating film until the gate insulating film is broken down, while the ordinate axis indicates the rate [%] of breakdown of the gate insulating film.

In FIG. 5, the linear plots means that the relationship between the time (tBREAK) and the rate [%] is represented by the Weibull distribution. It has been known before that the lifetimes of gate insulating films of semiconductor elements are represented by the Weibull distribution under conditions of a rating voltage or a voltage that is slightly higher than the rating voltage. Under conditions of a very high voltage, too, the above relationship is represented by the Weibull distribution as is apparent from FIG. 5.

If the gate insulating film is broken down, the amount of current IBP that flows through the anti-fuse element 11 increases suddenly at timing t5, as shown in FIG. 4. The potential sensing circuit 12A senses the beginning of this increase. The replenished charge measuring device 12D starts to operate and after a lapse of a given period of time (tDELAY), the write end signal ENDp supplied to the control circuit 14 is set at a high level.

When the write end signal ENDp becomes high, the write end signal ENDn becomes low at timing t6. Upon receiving the signal ENDn by the SR latch circuit, the control circuit 14 inactivates the selection signal SELp to be supplied to the open/close switch 13 (makes it low). The switch 13 is thus brought into nonconduction to cut off the current IBP flowing through the anti-fuse element 11. The gate insulting film of the element 11 is broken down and the element 11 is brought into conduction. The potential SNp at the connection node between the element 11 and switch 13 is almost equal to the high voltage VBP or a high potential.

If the gate insulating film has been broken down as information is written to the anti-fuse element 11, the high voltage VBP is not required. At timing t7, the high voltage VBP is dropped to 0 V (or not higher than the rating voltage of, e.g., 1.5 V of the element 11) to prevent another component (e.g., open/close switch 13) and the gate insulating film of the element 11 in non-program state from being broken down.

In read operation, such a low voltage as not to break the gate insulating film of the anti-fuse element 11, or the rating voltage (e.g., 1.5 V) is applied at timing t8. The potential SNp at the connection node between the element 11 and switch 13 is sensed. Information can thus be read out of the anti-fuse element 11.

FIGS. 6A to 6E are sectional views showing a MOS semiconductor having a three-layer structure of a silicon semiconductor (Si) 21, a silicon oxide film ($SiO_2$) 22 and a polysilicon layer (poly Si) 23. A relationship between a process of breaking the silicon oxide film 22 and information read characteristics of the MOS semiconductor used as a storage element will be described with reference to FIGS. 6A to 6E.

Figure 6A:
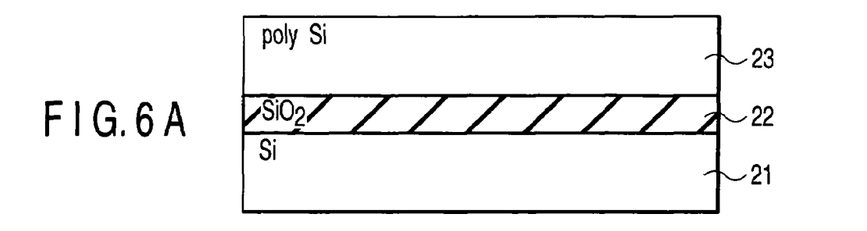
FIGS. 6A to 6E are sectional views showing a MOS semiconductor to illustrate a relationship between a process in which a silicon oxide film is broken down and information read characteristics.
Figure 6B:
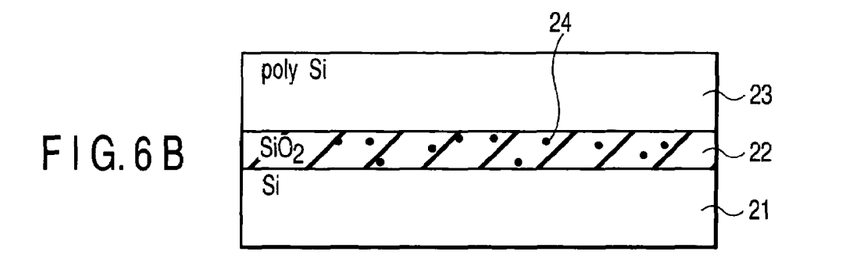

Immediately after the MOS semiconductor is manufactured, the silicon oxide film 22 has a very orderly crystal structure (FIG. 6A). In this MOS semiconductor, a negative potential is applied to the polysilicon layer 23 and a positive potential is applied to the silicon semiconductor 21:

Assuming here that the silicon oxide film 22 is as thin as about 3 nm and a potential difference of about 7 V is applied thereto, the electric field of the film 22 becomes as high as 2 GV/m or more. A very small leakage current flows through the film 22. Maintaining this condition for a long time, the leakage current causes very small defects 24 such as dislocations in the film 22 (FIG. 6B). In this step, however, the film 22 still remains in good insulating state and a slight leakage current (e.g., smaller than 10 nA) flows.

Figure 6C:
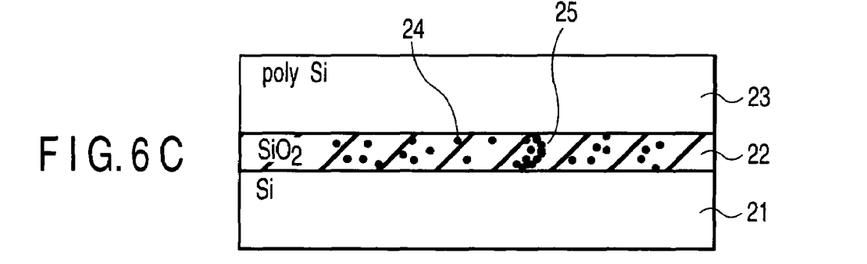

As time elapses, the very small defects 24 increase in number to finally form a defect chain 25 that reaches the silicon semiconductor 21 from the polysilicon layer 23 (FIG. 6C). In this step, the silicon oxide film 22 is brought into a soft breakdown, and leakage current that is considerably larger than before starts to flow through the film 22.

Figure 6D:
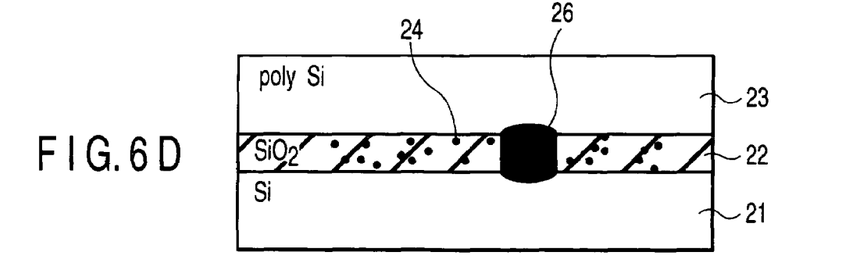

The amount of leakage current flowing through the film 22 in the soft breakdown state is so small that it does not reach 100 μA. However, the leakage current concentrates on a small area having several atoms in which the defect chain 25 has occurred, thereby generating a large amount of Joule heat and breaking its surrounding molecular structure. Consequently, a cylindrical breakdown spot 26 having a diameter of about 50 nm is formed (FIG. 6D). This spot is a conductor of several kiloohms as a hard breakdown of the silicon oxide film 22.

Figure 6E:
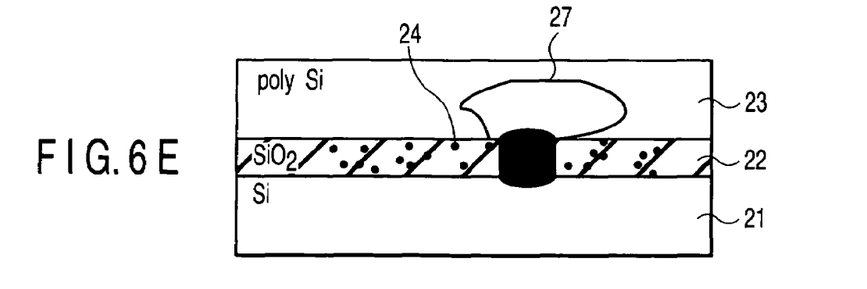

If the high voltage is continuously applied to the MOS semiconductor, current of more than 10 mA continues to flow through the MOS semiconductor. Finally, a disconnection 27 occurs in the polysilicon layer 23 (FIG. 6E).

In the OTP memory using the anti-fuse element as a storage element, the disconnection 27 means the breakage of other transistors, wiring and vias for forming the memory. The disconnection 27 occurs in a wide variety of forms. In either case, the current-voltage characteristics of the memory are not stabilized after the disconnection 27 occurs.

In order to achieve good read characteristics from the OTP memory, it is desirable to bring the insulating film into a hard breakdown as shown in FIG. 6D. The reason is as follows. In the soft breakdown shown in FIG. 6C, a current path (breakdown spot 26) is not completely formed and thus the breakdown spot 26 has a high resistance of 1 MΩ or more. Particularly in the over hard breakdown in which the transistors, wiring and vias for forming the memory will be broken down as shown in FIG. 6E, a relationship between voltage and current is not stable. In both the soft breakdown and the over hard breakdown, it is difficult to determine whether information is stored in the anti-fuse element in read mode.

According to the first embodiment, in the program operation, the internal step-up power supply 12 senses that the gate insulating film of the anti-fuse element 11 changes from a soft breakdown to a hard breakdown in accordance with an increase (variation) in the amount of current IBP flowing through the element 11 and then continues to supply electrical energy for a given period of time. It is thus possible to appropriately control electrical energy necessary and sufficient for bringing the gate insulating film of the element 11 into a hard breakdown with reliability. Consequently, good read characteristics can be obtained from the OTP memory.

Second Embodiment

Figure 7:
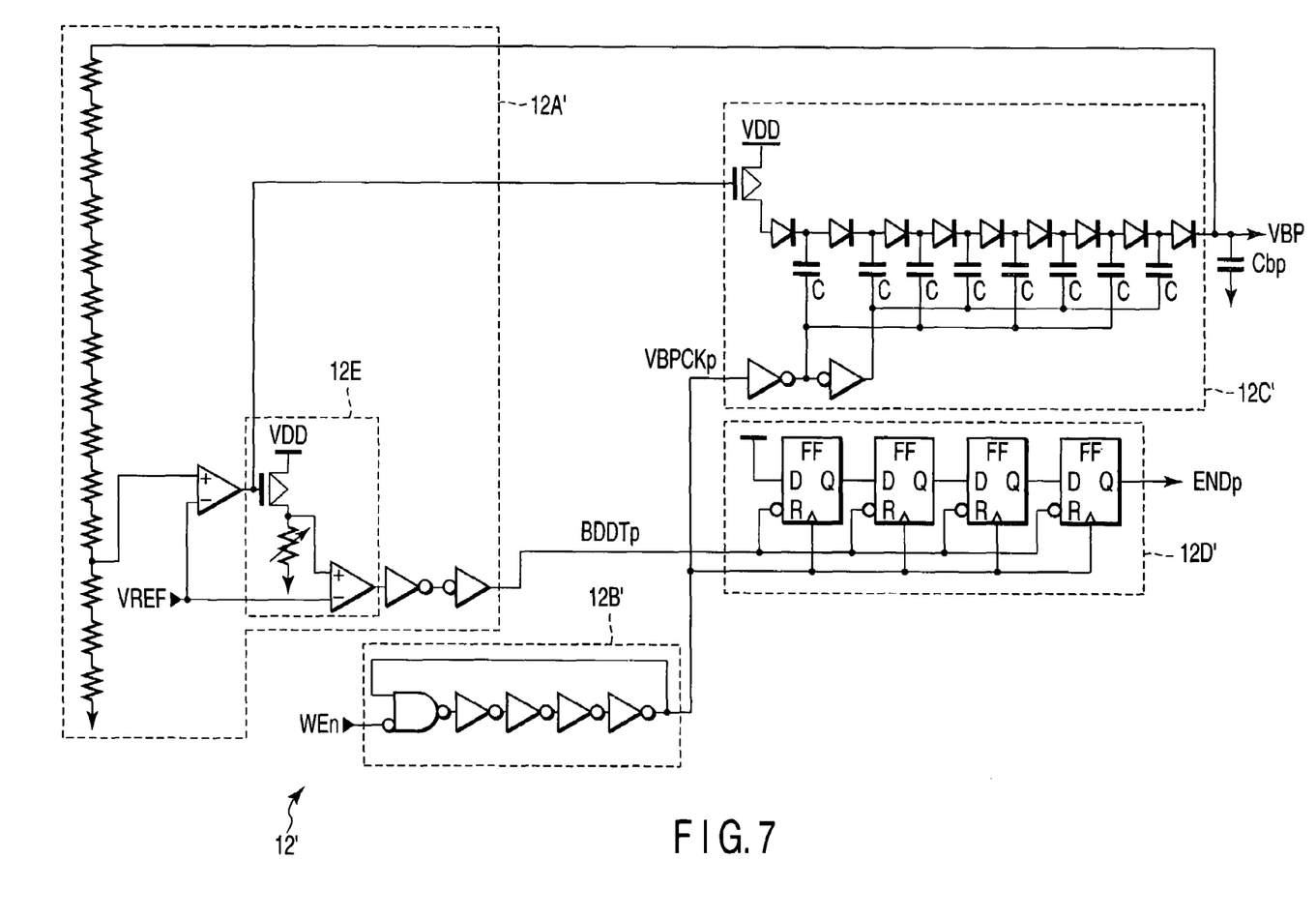
FIG. 7 is a circuit diagram showing an arrangement of an internal step-up power supply in an OTP memory according to a second embodiment of the present invention.

FIG. 7 shows an arrangement of an internal step-up power supply (power supply circuit) in an OTP memory (nonvolatile semiconductor memory device) according to a second embodiment of the present invention. The OTP memory uses an anti-fuse element (a semiconductor element having a MOS structure) as a storage element and can be written with information only once.

The internal step-up power supply 12' according to the second embodiment includes a potential sensing circuit (sensing circuit) 12A', an oscillator 12B', a charge pump circuit (voltage generation circuit) 12C', a replenished charge measuring device (counter circuit) 12D' and a load capacitor Cbp. The circuits 12A' and 12C' make up a feedback loop to generate a high voltage VBP stably.

The potential sensing circuit 12A' compares a step-up power supply voltage VBP with a reference power supply voltage VREF and controls the power supply current to be supplied to the charge pump circuit 12C' to keep the step-up power supply voltage VBP at a fixed value (set potential). The circuit 12A' includes a breakdown sensing circuit 12E that senses a breakdown state of the gate insulating film of the anti-fuse element 11 in program operation.

The oscillator 12B' is, for example, a five-stage ring oscillator and its oscillation and stopping are controlled in response to a write command signal WEn supplied from the outside.

The charge pump circuit 12C' is, for example, an eight-stage Dickson charge pump and operates upon receipt of an output VBPCKp of the oscillator 12B'. The charges step up by the charge pump circuit 12C' are stored in the load capacitor Cbp. The load capacitor Cbp is a decoupling capacitor between the power supply voltage VBP and ground power supply potential.

The replenished charge measuring device 12D' is composed of a four-stage flip-flop circuit (e.g., 32-bit counter) FF. The measuring device 12D' starts a count operation in response to an output (breakdown sensing signal) BDDTp of the potential sensing circuit 12A' and an output BPCKp of the oscillator 12B. When the charge pump circuit 12C' continuously performs a step-up operation four times, the device 12D' outputs a write end signal ENDp.

The breakdown sensing circuit 12E monitors the power supply current to be supplied to the charge pump circuit 12C'.

In program operation, information starts to be written to the anti-fuse element 11 if an open/close switch 13 is brought into conduction after the step-up power supply voltage VBP reaches a set value. The current consumption is very low before the gate insulating film of the element 11 is broken down and, in this case, the power supply current to be supplied to the charge pump circuit 12C' is small.

The above state continues to break down the gate insulating film of the anti-fuse element 11. Leakage current flows through the element 11 whose insulating film has been broken down and, accordingly, the current consumption increases. The potential sensing circuit 12A' increases the power supply current to be supplied to the charge pump circuit 12C' in order to maintain the step-up power supply voltage VBP. The breakdown sensing circuit 12E senses a breakdown (hard breakdown) of the element 11 with the increase in the power supply current as a criterion, and supplies the breakdown sensing signal BDDTp to the replenished charge measuring device 12D'.

The configuration of the measuring device 12D' is almost equal to that of the measuring device 12D of the first embodiment, as is the operation thereof. Their detailed descriptions are therefore omitted.

In the internal step-up power supply 12' of the second embodiment, a criterion for determining the state of a breakdown of the anti-fuse element 11 can be extended and adjusted with precision. A more stable program operation can thus be performed.

In the above first and second embodiments, for example, a potential barrier that is formed of an n-type MOS transistor can be added between the anti-fuse element 11 and open/close switch 13 to prevent the switch 13, a sense amplifier (19), etc. from being broken down by a high voltage. In this case, the gate of the n-type MOS transistor is connected to the internal step-up power supply (12, 12'), a logic circuit power supply (not shown) used in the control circuit (14), measuring device (12D, 12D') and the like, or an analog circuit power supply (not shown) used in the breakdown sensing circuit.

Third Embodiment

Figure 8:
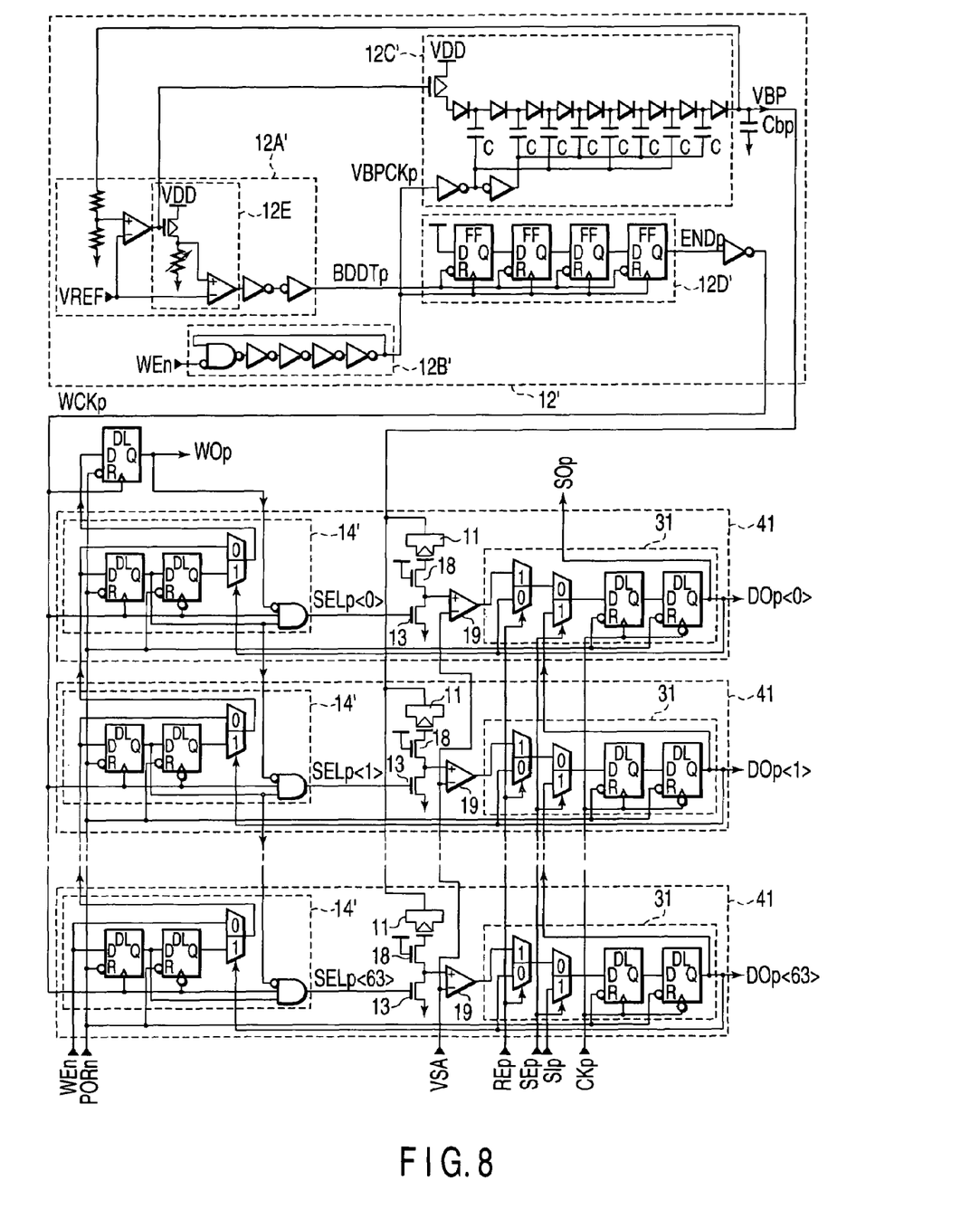
FIG. 8 is a circuit diagram showing an arrangement of an OTP memory according to a third embodiment of the present invention.

FIG. 8 shows an arrangement of an OTP memory (non-volatile semiconductor memory device) according to a third embodiment of the present invention. The OTP memory uses an anti-fuse element (a semiconductor element having a MOS structure) as a storage element and can be written with information only once. In the third embodiment, the OTP memory includes sixty-four repetitive units (storage cells) 41 that stores 64-bit information and an internal step-up power supply 12' as shown in FIG. 7. The same components as those of the second and third embodiment are denoted by the same reference numerals and their detailed descriptions are omitted.

Each (for one bit) of the repetitive units 41 includes an information storage unit having an anti-fuse element (insulating film breakdown type storage element) 11, a potential barrier (protection transistor) 18, an open/close switch (control switch) 13 and a sense amplifier 19. Each of the repetitive units 41 also includes a control circuit 14' and a data register 31.

In the information storage unit, the internal step-up power supply 12, which serving as a power supply circuit, is connected to one end (source/drain) of the anti-fuse element 11. The open/close switch 13, which is formed of an n-type MOS transistor, is connected in series to the other end (gate) of the element 11 through the potential barrier 18. A non-inverting input terminal of the sense amplifier 19 is connected to a connection node between the potential barrier 18 and the open/close switch 13, and an inverting input terminal is supplied with a reference potential VSA to perform a sense operation.

The potential barrier 18 is formed of, e.g., an n type MOS transistor to prevent the open/close switch 13, sense amplifier 19, etc. from being broken down by a high potential. The high voltage VBP, which is higher than the maximum rating and applied to the anti-fuse element 11 in program operation, is transmitted to the open/close switch 13, sense amplifier 19 and the like as the gate insulating film is broken down. With the source follower operation of the n-type MOS transistor of the potential barrier 18, the potential transmitted to the open/close switch 13, sense amplifier 19 and the like is set at one that is lowered by a threshold voltage from the power supply voltage VBP applied to the gate of the element 11. The open/close switch 13 and sense amplifier 19 can thus be prevented from being degraded and broken down.

The above advantage becomes significant when the open/close switch 13 is brought into nonconduction again after the anti-fuse element 11 is programmed. Though the high power supply voltage VBP that is not lower than the maximum rating is applied to the potential barrier 18 through the programmed element 11, the potential barrier 18 is not broken down because the gate is always set at a high potential.

The open/close switch 13 controls the application of voltage stress (or current stress) to the anti-fuse element 11. The conduction/nonconduction of the switch 13 is controlled in response to a control signal, such as a selection signal SELp (<0> to <63>) from the control circuit 14'.

The control circuit 14' generates the selection signal SELp to control the conduction/nonconduction of the switch 13. The control circuit 14' receives an inverted signal of the write end signal ENDp from the internal step-up power supply 12' as a write clock signal (clock signal of the program counter) WCKp for program operation and control signals such as a power-on reset signal PORn corresponding to the reset signal RESETn and a write command signal WEn from the outside.

The sense amplifier 19 reads information ("0"/"1" data) from the anti-fuse element 11 as a variation in potential with the state of the gate insulating film, and amplifies the information.

The data register 31 temporarily holds the information amplified by the sense amplifier 19 and supplies it to the outside through data output terminal DOp (<0> to <63>)

In the third embodiment, signal lines for supplying a shift set command signal SEp, a clock signal CKp for the data register (DL latch circuit) and a read command signal REp as well as signal lines for supplying the write clock signal WCKp, power-on reset signal PORn and the reference potential VSA of the sense amplifier 19 are connected to the sixty-four repetitive units 41. Further, signal lines for supplying a write data input signal SIp and the write command signal WEn are serial-connected to the repetitive units 41.

In program operation, the data register 31 holds data to be written as well as holds the read data. The data output terminal DOp is connected to the control circuit 14'. The data written to the anti-fuse element 11 is a write data input signal SIp. The data is sent out to the data register 31 by a shift set operation performed by the shift set command signal SEp. The operation of programming the anti-fuse element 11 is performed for each bit in response to the write command signal WEn and write clock signal WCKp.

In read operation, the read data sensed by the sense amplifier 19 is output from the data output terminal DOp corresponding to each bit through the data register 31.

Figure 9:
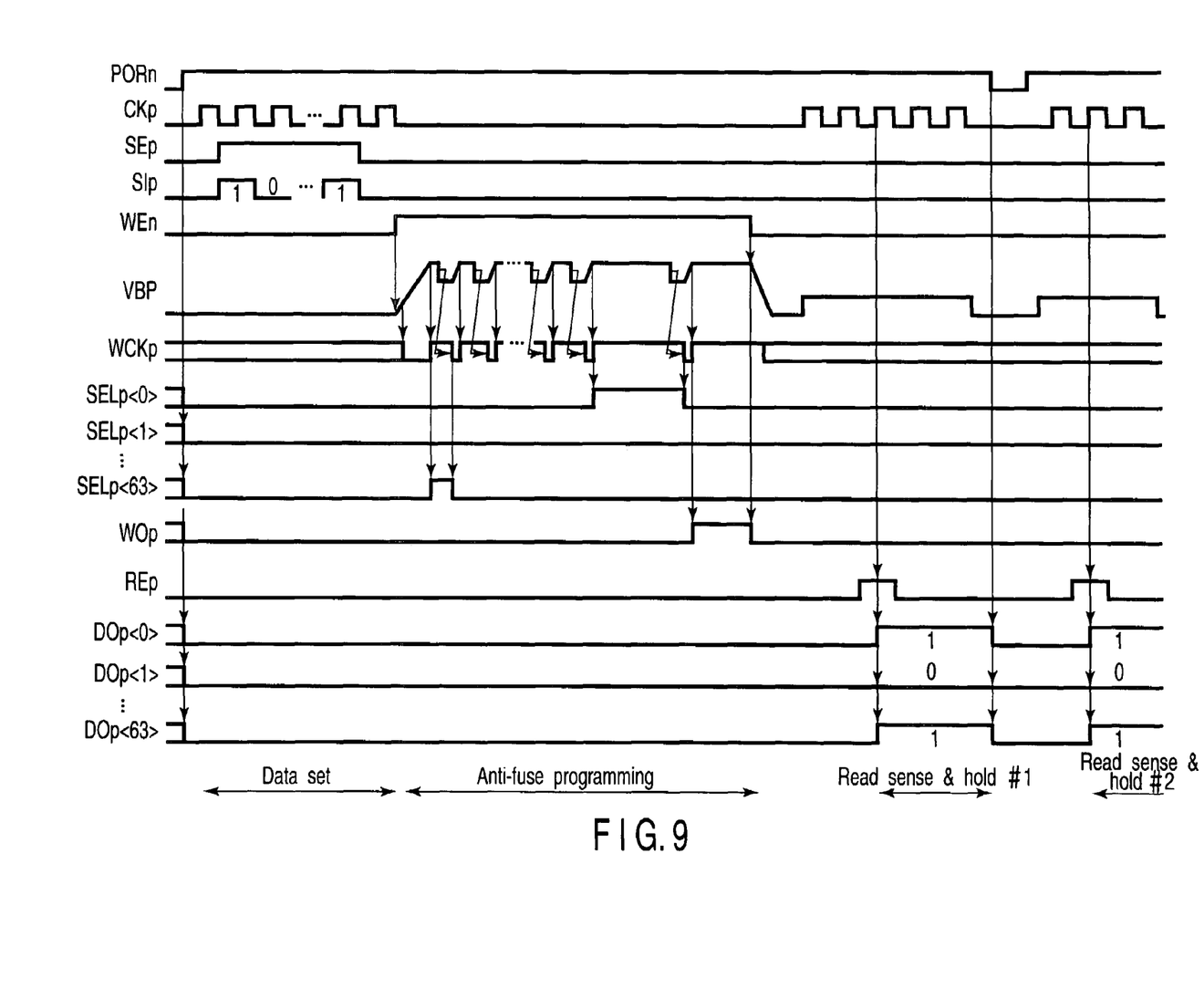
FIG. 9 is a timing chart of operations of the OTP memory shown in FIG. 8.

FIG. 9 illustrates operations of the OTP memory shown in FIG. 8. Some of the operations will be described below.

Power-On Reset Operation

After power is turned on, a power-on reset signal PORn is set at "0" and the latch circuit in each of the repetitive units 41 is reset. Thus, the data register 31 is reset and the data output terminal DOp is set at "0."

Data Set Operation

A shift set command signal SEp is set at "1" and data to be written to the anti-fuse element 11 of address <0>, e.g., "1" (data for programming the anti-fuse element 11 of address <0>) is input as a write data input signal SIp. This input data is received at the rising edge of a clock signal CKp and set in the data register 31 of address <63>.

Then, data to be written to the anti-fuse element 11 of address <1>, e.g., "0" (data for programming the anti-fuse element 11 of address <1>) is input as a write data input signal SIp, while keeping the shift set command signal SEp at "1". This input data is received at the rising edge of the next clock signal CKp and set in the data register 31 of address <63>.

The data stored in the data register 31 of address <63>, which is to be written to the anti-fuse element 11 of address <0>, is transferred to the data register 31 of the next address <62>. In other words, this operation is repeated sixty-four times to set data to be written to all the data registers 31.

Anti-Fuse Programming Operation

The OTP memory according to the third embodiment need not receive any clock signal CKp in program operation. By simply holding the write command signal WEn at "1", a step-up power supply voltage VBP is automatically generated, and information is written to the anti-fuse element 11 for each bit in accordance with the write data stored in advance in the data register 31. Finally, the write end signal WOp is output.

When the write command signal WEn is input, the step-up power supply voltage VBP starts to rise. The oscillator 12B' of the internal step-up power supply 12' operates and upon receiving its output VBPCKp, the charge pump circuit 12C' increases the step-up power supply voltage VBP. The power supply current to be supplied to the charge pump circuit 12C' increases while the step-up power supply voltage VBP is increasing. The output (breakdown sensing signal) BDDTp of the breakdown sensing circuit 12E becomes "1".

If the output BDDTp continues to remain at "1" while the output VBPCKp of the oscillator 12B' continuously rises four times, the output signal (write end signal) ENDp of the replenished charge measuring device 12D' shifts to "1". The write clock signal WCKp, which is an inverted signal of the write end signal ENDp, is reset to "0". This state is maintained until the step-up power supply voltage VBP of the internal step-up power supply 12' reaches the set potential determined by the reference power supply voltage VREF and the resistance ratio of the potential sensing circuit 12A'. When the step-up power supply voltage VBP reaches the set potential, the power supply current is interrupted to the charge pump circuit 12C'.

Performing the above operations, the OTP memory is ready to write data to the anti-fuse element 11. The write command signal WEn continues to remain at "1" and information is written to the anti-fuse element 11 for each bit.

Paying attention to the internal operation of the OTP memory, if the step-up power supply voltage VBP reaches the set potential and the power supply current is interrupted to the charge pump circuit 12C', the output BDDTp of the breakdown sensing circuit 12E is reset to "0". Accordingly, the flip-flop FF in the replenished charge measuring device 12D' is reset, and the output signal ENDp of the device 12D' becomes "0".

The write clock signal WCKp, which is an inverted signal of the write end signal ENDp, shifts to "1". At the rising edge of the write clock signal WCKp, the actual data write to the anti-fuse element 11 starts.

The sixty-four control circuits 14' receive write command signals WEn of serial-connected signal lines. In the third embodiment, the write clock signal WCKp is supplied to all of the sixty-four control circuits 14'. Of these control circuits 14', one control circuit 14' is selected by the write command signal WEn and the output signal (DOp) of the data register 31, and only the selection signal SELp thereof shifts to "1".

In the example shown in FIG. 9, only the write command signal SELp <63> shifts to "1" by the first input of the write clock signal WCKp. If the write command signal SELp <63> shifts to "1", its corresponding open/close switch 13 is brought into conduction and a high voltage stress is applied to the anti-fuse element 11.

As the above state continues, the gate insulating film of the anti-fuse element 11 of address <63> is broken down (hard breakdown), and the leakage current of the step-up power supply voltage VBP increases suddenly. Since the potential sensing circuit 12A' maintains the step-up power supply voltage VBP, the power supply current to be supplied to the charge pump circuit 12C' increases. The breakdown sensing circuit 12E senses a breakdown of the anti-fuse element 11 with the increase in the power supply current as a criterion, and sets a breakdown sensing signal BDDTp at "1".

If the breakdown sensing signal BDDTp is input to the replenished charge measuring device 12D' and continues to remain at "1" while the output VBPCKp of the oscillator 12B' continuously rises four times, the output signal (write end signal) ENDp of the device 12D' shifts to "1". The write clock signal WCKp, which is an inverted signal of the write end signal ENDp, is reset to "0" again. Upon receipt of the write clock signal WCKp to be reset, the output signal SELp (SELp <63> in FIG. 9 that has been activated is reset to "0" again.

The open/close switch 13 is brought into nonconduction again, and the current stress on the anti-fuse element 11 is reduced. Thus, the current consumption of the step-up power voltage VBP of the internal step-up power supply 12 is reduced again and finally the step-up power supply voltage VBP of the internal power supply 12' reaches the set value.

With the above operation, data is written to the anti-fuse element 11 in units of bits. In other words, the write of data to the anti-fuse element 11 for each of bits is automatically repeated and finally the write of all of data "1" to the data register 31 is completed.

If the write of the last data is completed, the write end signal WOp becomes "1". If the write command signal WEn returns to "0" after the signal WOp becomes "1", the internal step-up power supply 12' stops operating and all the program operations are completed.

Read Sense & Hold Operation

FIG. 9 shows a read operation (read sense & hold #1) performed immediately after data is written and a read operation (read sense & hold #2) performed immediately after power-on is reset. These read operations are the same.

The step-up power supply voltage VBP of the internal step-up power supply 12' increases to the same potential as the power supply voltage VDD used in a normal logic circuit, such as 1.5 V. To do so, the power supply 12' has only to operate while a lower reference power supply voltage VREF is being applied to the power supply 12', or the power supply voltage VDD and step-up power supply voltage VBP have only to be short-circuited.

Then, a voltage is applied to the anti-fuse element 11, and the stored information appears as the potential of the other end of the element 11. Current flows into the element 11 that stores information via the broken gate insulating film, and the potential of the other end becomes high.

The anti-fuse element 11 that stores no information is insulated by the gate insulating film, and the potential of the other end remains low. The potential of output data "1" is not always equal to the power supply voltage VDD due to the breakdown state of the gate insulating film, the influence of coupling capacitance, and the like, or the potential of data "0" is not always equal to 0 V.

The above halfway potential is amplified by the sense amplifier 19 to obtain a power supply voltage VDD or a logical output of 0 V. The sense amplifier 19 is supplied with a logical threshold voltage (reference potential) VSA that is a criterion for discriminating between data "0" and data "1".

The clock signal CKp shifts "0" to "1" while the read command signal REp is at "1". At this moment, the data read out of the anti-fuse element 11 by the sense amplifier 19 is received by the DL latch circuit through the data register 31. This data also appears at the data output terminal DOp.

If the read command signal REp is finally returned to "0", the read data is held in the data register 31 even though the clock signal CKp is input, and the data output terminal DOp does not vary in condition.

As described above, according to the third embodiment, the gate insulating film of the anti-fuse element 11 can reliably be brought into a hard breakdown by controlling high potential application time appropriately in write mode, and the anti-fuse element 11 and its surrounding transistors can be prevented form being broken down due to overvoltage stress. Consequently, the anti-fuse element 11 has good read characteristics to allow data to be read out with stability.

According to the third embodiment, write time can be shortened. The following steps are automatically executed: a step of applying a high voltage to the anti-fuse element 11, a step of sensing that the gate insulating film of the anti-fuse element 11 has been brought into a hard breakdown, and a step of bringing a breakdown spot into a stable state (hard breakdown) with reliability.

In order to achieve good read characteristics, it is important to keep the application of current stress constant. To do so, the OTP memory includes the breakdown sensing circuit 12E and replenished charge measuring device 12D'. There is a limit to the current supply capability of the internal step-up power supply 12'. If, therefore, data is written to a plurality of anti-fuse elements 11 at the same time, the current flowing through each of the elements 11 cannot be kept constant. It is thus necessary to perform the write operation for each bit. This write operation for each bit can be repeated automatically particularly if the inverted signal of the write end signal ENDp is used as a clock signal (WCKp) of the program counter. Almost no waste time occurs in the repetition of the write operation as shown in FIG. 10A.

In contrast, conventionally, it is general that the application of current stress and the timing of repetitive operation in program operation are controlled by an externally supplied clock. The program time from when a high voltage stress is applied to the anti-fuse element until the gate insulating film of the anti-fuse element is brought into a hard breakdown varies from anti-fuse element to anti-fuse element. For this reason, conventionally, data has to be written at a low clock frequency to prevent the anti-fuse element from failing to store data. Consequently, as shown in FIG. 10B, most of anti-fuse elements are broken down in the early stage, and the application of current stress is lengthened longer than required, resulting in waste time. This waste time is lengthened as the number of write bits increase.

Figure 10A:
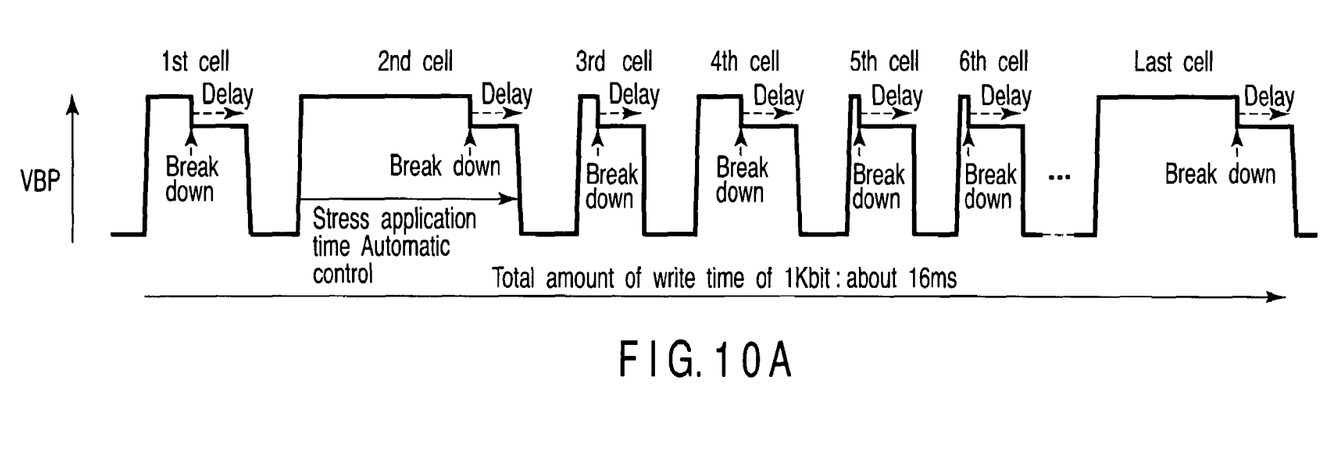
FIG. 10A is a chart of the total amount of write time in program operations performed by a method of the present invention.
Figure 10B:
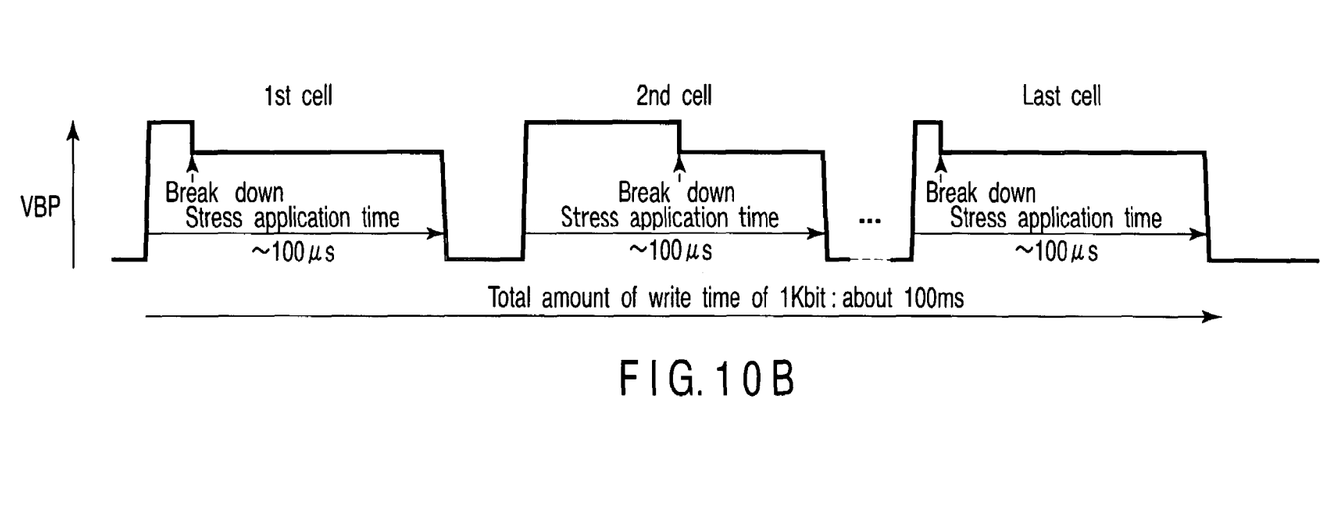
FIG. 10B is a chart of the total amount of write time in program operations performed by a prior art method.

In a 1-Kbit OTP memory using an anti-fuse element having a write time characteristic as represented by the Weibull distribution shown in FIG. 5, a time period of 100 ms (=100 μs×1 Kbit) is required using a prior art method, whereas it can be reduced to about 16 ms using the method of the third embodiment (see FIG. 10A).

The OTP memory according to the third embodiment can be so configured that all the repetitive units 41 have a data register 31 and a control circuit 14' in common. It can adopt an internal step-up power supply 12 configured as shown in FIG. 3 or an information storage unit as shown in FIG. 1.

The present invention can be applied to an OTP memory in which information is automatically written for each bit to a plurality of storage elements arranged in matrix (see Japanese Patent Application No. 2004-366447).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a storage element of an insulating film breakdown type, which is programmed with information;
   a power supply circuit connected to one end of the storage element to apply a high voltage that is not lower than a maximum rating to the storage element;
   an open/close switch connected to another end of the storage element to control application of the high voltage to the storage element from the power supply circuit;
   a control circuit which controls an open/close operation of the open/close switch;
   a sensing circuit which senses that an insulating film of the storage element is broken down by the application of the high voltage from the power supply circuit;
   an oscillator which oscillates; and
   a counter circuit which counts in response to an output of the sensing circuit and an output of the oscillator,
   wherein the device is programmed by controlling the control circuit such that an output of the counter circuit interrupts the application of the high voltage to the storage element from the power supply circuit after a lapse of a given period of time.

2. The nonvolatile semiconductor memory device according to claim 1, wherein the power supply circuit includes a charge pump circuit which performs a step-up operation in response to the output of the oscillator, and the charge pump circuit performs the step-up operation to replenish the counter circuit with charges corresponding to those consumed by current flowing through the storage element whose insulating film is broken down.

3. The nonvolatile semiconductor memory device according to claim 1, wherein the sensing circuit is a breakdown sensing circuit which senses a potential difference caused at both ends of the open/close switch.

4. The nonvolatile semiconductor memory device according to claim 1, wherein the sensing circuit is a breakdown sensing circuit which senses a variation in the amount of current flowing through the storage element.

5. The nonvolatile semiconductor memory device according to claim 1, wherein the high voltage applied from the power supply circuit is a voltage enough to break the insulating film of the storage element.

6. The nonvolatile semiconductor memory device according to claim 1, wherein the output of the counter circuit is used as a clock signal of a program counter to write information to the storage element for each bit.

7. The nonvolatile semiconductor memory device according to claim 1, further comprising a protection transistor between the storage element and the open/close switch.

* * * * *